(12) United States Patent
Wu et al.

(10) Patent No.: US 8,134,144 B2
(45) Date of Patent: Mar. 13, 2012

(54) THIN-FILM TRANSISTOR

(75) Inventors: Yiliang Wu, Mississauga (CA); Jessica Sacripante, Oakville (CA); Beng S. Ong, Mississauga (CA); Paul Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 613 days.

(21) Appl. No.: 11/317,746

(22) Filed: Dec. 23, 2005

(65) Prior Publication Data

US 2007/0145357 A1 Jun. 28, 2007

(51) Int. Cl.
*H01L 51/30* (2006.01)

(52) U.S. Cl. ............ 257/40; 257/E51.007; 257/E51.046

(58) Field of Classification Search .................... 257/40, 257/E51.001–E51.052; 438/99
See application file for complete search history.

(56) References Cited

U.S. PATENT DOCUMENTS

| | | | | |
|---|---|---|---|---|
| 4,626,556 A * | 12/1986 | Nozue et al. | ...................... | 522/99 |
| 5,500,537 A * | 3/1996 | Tsumura et al. | ................. | 257/40 |
| 5,892,244 A * | 4/1999 | Tanaka et al. | .................... | 257/40 |
| 6,891,237 B1 * | 5/2005 | Bao et al. | ........................ | 257/410 |
| 6,946,676 B2 * | 9/2005 | Kelley et al. | ..................... | 257/40 |
| 6,989,336 B2 * | 1/2006 | Meth et al. | ...................... | 438/780 |
| 7,102,154 B2 * | 9/2006 | Hanna et al. | ..................... | 257/40 |
| 2002/0045289 A1 * | 4/2002 | Dimitrakopoulos et al. | ... | 438/99 |
| 2002/0155729 A1 * | 10/2002 | Baldwin et al. | ............... | 438/780 |
| 2004/0129978 A1 * | 7/2004 | Hirai | ............................. | 257/347 |
| 2005/0029514 A1 * | 2/2005 | Moriya | ........................... | 257/40 |
| 2005/0095448 A1 * | 5/2005 | Katz et al. | ...................... | 428/689 |
| 2005/0110008 A1 * | 5/2005 | Koo et al. | ........................ | 257/40 |
| 2005/0211975 A1 * | 9/2005 | Kawasaki et al. | ................ | 257/40 |
| 2005/0243264 A1 * | 11/2005 | Sikharulidze | ................. | 349/177 |
| 2005/0247928 A1 * | 11/2005 | Unno | .............................. | 257/40 |
| 2005/0287728 A1 * | 12/2005 | Arias | ............................. | 438/197 |
| 2006/0054883 A1 * | 3/2006 | Hanna et al. | ..................... | 257/40 |
| 2006/0094153 A1 * | 5/2006 | Furukawa | ........................ | 438/99 |
| 2006/0192197 A1 * | 8/2006 | Koganei | ........................... | 257/40 |
| 2007/0012914 A1 * | 1/2007 | Miura et al. | ..................... | 257/40 |
| 2007/0012950 A1 * | 1/2007 | Cain et al. | ...................... | 257/194 |
| 2007/0018102 A1 * | 1/2007 | Braune et al. | ............... | 250/336.1 |
| 2007/0031990 A1 * | 2/2007 | Maekawa | ........................ | 438/99 |
| 2008/0283825 A1 * | 11/2008 | Chua et al. | ...................... | 257/40 |

FOREIGN PATENT DOCUMENTS

| | | | |
|---|---|---|---|
| WO | WO 03067667 A1 * | 8/2003 | |
| WO | WO 2004091001 A1 * | 10/2004 | |
| WO | WO 2005008789 A2 * | 1/2005 | |
| WO | WO 2005086254 A1 * | 9/2005 | |
| WO | WO 2006025473 A1 * | 3/2006 | |

OTHER PUBLICATIONS

Ong, B., et al. "Polythiophene-Based Field-Effect Transistors With Enhanced Air Stability." Synth. Met., vol. 142, No. 1-3 (Apr. 13, 2004): pp. 49-52.*
Puigdollers, J., et al. "Electrical Characterization of Pentacene Thin-Film Transistors with Polymeric Gate Dielectric." Synth. Met., vol. 146 (Sep. 28, 2004): pp. 355-358.*
Puigdollers, J., et al. "Pentacene Thin-Film Transistors on Polymeric Gate Dielectric: Device Fabrication and Electrical Characterization." J. Non-Cryst. Sol., vol. 338-340 (Apr. 9, 2004): pp. 617-621.*
Puigdollers, J., et al. "Pentacene Thin-Film Transistors with Polymeric Gate Dielectric." Org. Elect., vol. 5 (2004): pp. 67-71.*

* cited by examiner

*Primary Examiner* — Matthew W Such
(74) *Attorney, Agent, or Firm* — Fay Sharpe LLP

(57) ABSTRACT

There is provided herein a performance-enhancing composition comprising inorganic nanoparticles dispersed in a polymer selected from the group consisting of polysiloxane, polysilsesquioxane, and mixtures thereof. This composition, when applied to a thin-film transistor, such as a bottom-gate thin-film transistor, as an overcoat or top layer, improves the carrier mobility and current on/off ratio of the thin film transistor. Also provided is the thin-film transistor produced utilizing this process and/or composition.

4 Claims, 1 Drawing Sheet

THIN-FILM TRANSISTOR

STATEMENT REGARDING FEDERALLY SPONSORED RESEARCH

This development was made with United States Government support under Cooperative Agreement No. 70NANBOH3033 awarded by the National Institute of Standards and Technology (NIST). The United States Government has certain rights in the development.

CROSS-REFERENCE TO RELATED APPLICATIONS

This application relates to U.S. patent application Ser. No. 11/318,044, filed Dec. 23, 2005, and to U.S. patent application Ser. No. 11/317,168, filed Dec. 23, 2005; these disclosures are hereby incorporated by reference in their entirety.

BACKGROUND

The present disclosure relates, in various embodiments, to compositions suitable for use in electronic devices, such as thin film transistors ("TFT"s). The present disclosure also relates to layers produced using such compositions and electronic devices containing such layers.

Thin film transistors (TFTs) are fundamental components in modern-age electronics, including, for example, sensors, image scanners, and electronic display devices. TFT circuits using current mainstream silicon technology may be too costly for some applications, particularly for large-area electronic devices such as backplane switching circuits for displays (e.g., active matrix liquid crystal monitors or televisions) where high switching speeds are not essential. The high costs of silicon-based TFT circuits are primarily due to the use of capital-intensive silicon manufacturing facilities as well as complex high-temperature, high-vacuum photolithographic fabrication processes under strictly controlled environments. It is generally desired to make TFTs which have not only much lower manufacturing costs, but also appealing mechanical properties such as being physically compact, lightweight, and flexible.

TFTs are generally composed of a supporting substrate, three electrically conductive electrodes (gate, source and drain electrodes), a channel semiconductor layer, and an electrically insulating gate dielectric layer separating the gate electrode from the semiconductor. The channel semiconductor is in turn in contact with the source and drain electrodes. The materials used to make the TFTs, and the interfacial properties between various layers of semiconductor, dielectric, and electrodes will affect the performance of the TFTs. Accordingly, a great deal of recent effort has been devoted to improving the TFT device performance through new materials design, optimization of interfaces, etc. However, there is a continued need for materials which improve TFT device performance.

BRIEF DESCRIPTION

The present disclosure is directed, in various embodiments, to a thin film transistor, such as a bottom-gate thin-film transistor, having a performance-enhancing top or overcoat layer. In specific embodiments, the performance-enhancing layer comprises a polymer selected from the group consisting of polysiloxane, polysilsesquioxane, polystyrene, poly(α-methyl styrene), and mixtures thereof. In further embodiments, the performance-enhancing layer further comprises inorganic particles.

In further specific embodiments, the polymer is selected from the group consisting of polysiloxane, polysilsesquioxane, and mixtures thereof.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
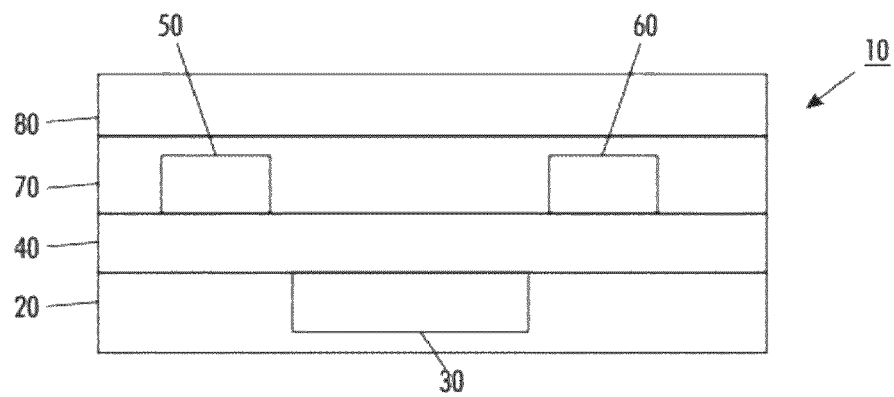
FIG. 1 is a first exemplary embodiment of a TFT having a performance-enhancing top layer according to the present disclosure.

A more complete understanding of the components, processes, and apparatuses disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first exemplary embodiment of a TFT configuration. This is a bottom-gate configuration. The TFT 10 comprises a substrate 20 in contact with the gate electrode 30 and a dielectric layer 40. Although in FIG. 1 the gate electrode 30 is depicted within the substrate 20, this is not required. However, it is important that the dielectric layer 40 separates the gate electrode 30 from the source electrode 50, drain electrode 60, and the semiconductor layer 70. The source electrode 50 contacts the semiconductor layer 70. The drain electrode 60 also contacts the semiconductor layer 70. The performance-enhancing top layer 80, covers the semiconductor layer 70.

Figure 2:
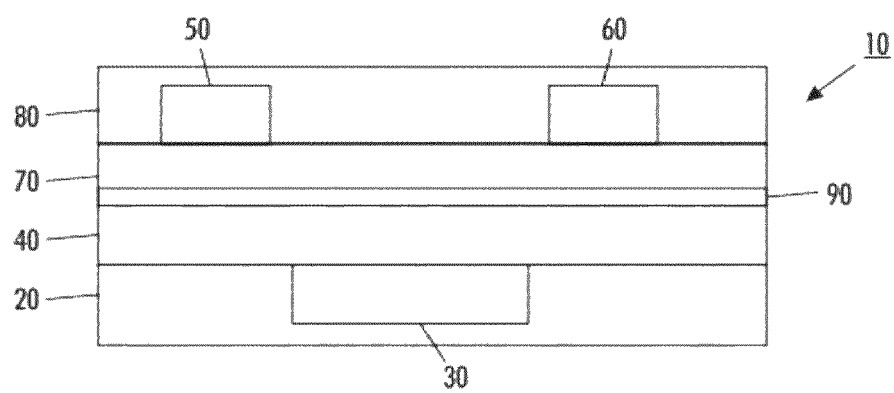
FIG. 2 is a second exemplary embodiment of a TFT having a performance-enhancing top layer according to the present disclosure.

FIG. 2 illustrates a second exemplary embodiment of a TFT configuration. Here, the semiconductor layer 70 contacts the dielectric layer 40 and separates the dielectric layer from the source electrode 50 and drain electrode 60. The performance-enhancing top layer 80 runs over and between the source and drain electrodes 50 and 60.

Figure 3:
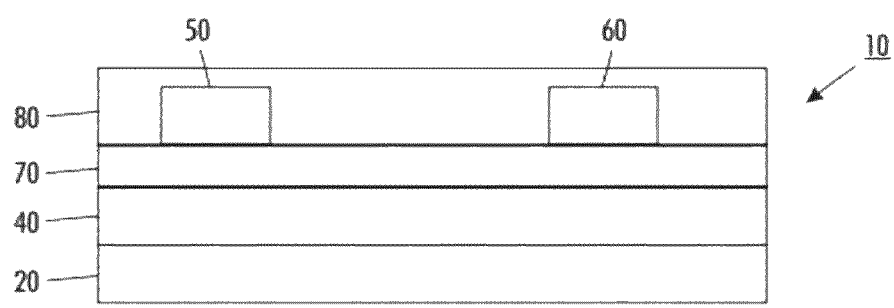
FIG. 3 is a third exemplary embodiment of a TFT having a performance-enhancing top layer according to the present disclosure.

FIG. 3 illustrates a third exemplary embodiment of a TFT configuration. The only difference between this configuration and that of FIG. 2 is that here, the substrate 20 also acts as the gate electrode.

In the exemplary embodiments disclosed herein, the terms "top" layer and "bottom" layer refer to location of the layer respective to the semiconductor channel layer (the semiconductor layer located in the TFT channel). A layer that is on top of, directly or indirectly, the semiconductor channel layer is considered as a top layer. For example, a performance-enhancing top layer indicates that the performance-enhancing layer is on top of the semiconductor channel layer. A layer is under, directly or indirectly, the semiconductor channel layer is considered as a bottom layer. For example, in the embodiments here, the term "bottom-gate" indicates that a gate layer is under or below the semiconductor layer. The terms "performance-enhancing" refers to improvement of the TFT performance such as mobility, current on/off ratio. In the exemplary embodiments, by applying a performance-enhancing layer at the top of a semiconductor layer of a TFT, the performance of the TFT is improved in terms of mobility and/or current on/off ratio.

The semiconductor layer always contacts the performance-enhancing top layer in order to give high performance to the device. In other embodiments, the performance-enhancing top layer is a performance-enhancing overcoat layer or an overcoat layer.

The performance-enhancing top or overcoat layer of the present disclosure comprises a polymer selected from the group consisting of polysiloxane, polysilsesquioxane, polystyrene, poly(α-methyl styrene), and mixtures thereof. In further specific embodiments, the polymer is selected from the group consisting of polysiloxane, polysilsesquioxane, and mixtures thereof. Polysiloxanes have a chemical structure as shown in Formula (I) below:

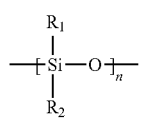

Formula (I)

wherein $R_1$ and $R_2$ are independently selected from alkyl, alkenyl, aryl, arylalkyl, and hydrogen; wherein $R_1$ and $R_2$ may further contain a heteroatom selected from the group consisting of oxygen, sulfur, and nitrogen; and wherein n is the degree of polymerization.

In one embodiment, the $R_1$ and $R_2$ are independently selected from $C_1$-$C_{40}$ aliphatic, $C_4$-$C_{40}$ alicyclic, $C_7$-$C_{40}$ arylalkyl, $C_6$-$C_{20}$ aryl, and a combination thereof. In embodiments, n is from about 4 to about 10,000. In further embodiments, n is from about 10 to about 5,000.

Polysilsesquioxanes have a chemical structure as shown in Formula (II) below:

$$(SiR)_{2n}O_{3n} \quad (II)$$

wherein the Rs, which can be the same or different from each other, are independently selected from, alkyl, alkenyl, aryl, arylalkyl, and hydrogen; wherein the Rs may further contain a heteroatom selected from the group consisting of oxygen, sulfur, and nitrogen; and wherein n is the degree of polymerization. In one embodiment, the Rs are independently selected from $C_1$-$C_{40}$ aliphatic, $C_4$-$C_{40}$ alicyclic, $C_7$-$C_{40}$ arylalkyl, $C_6$-$C_{20}$ aryl, and a combination thereof. In embodiments, n is from about 2 to about 10,000. In further embodiments, n is from about 5 to about 5,000. In some embodiments, the Rs are the same. In some specific embodiments, the polymer is poly(methyl silsesquioxane).

Polysiloxanes and polysilsesquioxanes have several characteristics which make them suitable for use in TFTs as performance-enhancing layer. They are very compatible with semiconductor materials; in particular, p-type semiconductors such as polythiophenes and pentacenes. The term "compatible" refers to how well the semiconductor layer can perform electrically when it contacts with the performance-enhancing layer. For example, a hydrophobic surface is generally preferred for polythiophene semiconductors. Polysiloxanes and polysilsesquioxanes can also be cured at a relatively low temperature such as below 200° C. They are also compatible with plastic materials such as MYLAR and thus suitable for use in flexible integrated circuits. Finally, they are reasonably soluble in common organic solvents and thus lend themselves to solution processes such as spin coating, stencil/screen printing, stamping, jet-printing, etc.

in further embodiments, the performance-enhancing layer further comprises inorganic particles. These inorganic particles are dispersed evenly or unevenly throughout the polymer. In specific embodiments, the performance-enhancing layer comprises inorganic particles selected from the group consisting of $Al_2O_3$, $TiO_2$, $ZrO_2$, $La_2O_3$, $Y_2O_3$, $Ta_2O_5$, $ZrSiO_4$, $Si_3N_4$, SrO, SiO, $SiO_2$, MgO, CaO, $HfSiO_4$, $BaTiO_3$, $HfO_2$, and mixtures thereof. Particles of from about 1 nanometer (nm) to about 5 micrometers (μm) in average size are used. In further embodiments, nanoparticles of from about 1 nm to about 999 nm in average size are used. In specific embodiments, nanoparticles of from about 1 nm to about 100 nm are used. Nanoparticles are used because they aid in forming a smooth surface. The particles or nanoparticles may have any shape, such as sphere or rod Inorganic particles are "high-density materials". A high-density material is a material with atomic spacing sufficiently close such that diffusion of outside species like water is hindered. Therefore, inorganic particles can act as a moisture barrier.

The polymer and the inorganic particles are usually mixed together in a weight ratio (polymer:inorganic particles) of from about 1:1 to about 19:1. In specific embodiments, they are mixed together in a weight ratio of from about 4:1 to about 19:1.

In some embodiments, the performance-enhancing layer is an overcoat layer. As seen in the Figures, performance enhancing layer 80 covers the semiconductor layer 70. In some embodiments, an interfacial layer 90 may also lie between the dielectric and semiconductor layers (see FIG. 2). This disclosure also contemplates TFTs which have this performance-enhancing layer and electronic devices, such as light emitting diodes or display monitors, which use such TFTs. TFTs incorporating the performance-enhancing layer have shown high field-effect carrier mobility and high current on/off ratio. The performance-enhancing layer has a thickness of from about 1 nanometer (nm) to about 10 micrometers (μm), preferably from about 100 nm to about 1 micrometer.

The performance-enhancing layer can be applied using known methods. It is generally dissolved/dispersed in a common organic solvent such as water, alcohol, ketone, ether, toluene, phenol, DMF, or THF. This solution is then applied to the thin film transistor. After the solvent is removed, the performance-enhancing layer is left behind on the transistor.

As previously mentioned, TFTs generally comprise a supporting substrate, three electrically conductive electrodes (gate, source and drain electrodes), a channel semiconductor layer, and an electrically insulating gate dielectric layer separating the gate electrode from the semiconductor. TFTs according to the present disclosure further comprise a performance-enhancing layer. The other layers and their composition/manufacture are discussed below.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally comprises an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

The semiconductor layer generally is an organic semiconducting material. Examples of organic semiconductors include but are not limited to acenes, such as anthracene, tetracene, pentacene, and their substituted derivatives, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives. In particular, polythiophenes may be used in the transistors of the present disclosures. The polythiophene may be selected from the group consisting of regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, and polythiophenes comprising non-thiophene based aromatic groups. In one exemplary embodiment, the semiconductor used is a p-type semiconductor. In another exemplary embodiment, the semiconductor is a liquid crystalline semiconductor. The semiconductor layer is from about 5 nm to about 1000 nm thick. In certain configurations, the semiconductor layer completely covers the source and drain electrodes. In other configurations, the semiconductor layer only covers partial source and drain electrodes. The semiconductor layer can be formed by molecular beam deposition, vacuum evaporation, sublimation, spin-on coating, dip coating and other conventional processes known in the art, including those processes described in forming the gate electrode.

The source and drain electrodes can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thicknesses are about, for example, from about 40 nanometers to about 1 micrometer with a more specific thickness being about 100 to about 400 nanometers. The TFTs of the present disclosure contain a semiconductor channel. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about 80 volts is applied to the drain electrode to collect the charge carriers transported across the semiconductor channel when a voltage of generally, for example, about +10 volts to about −80 volts is applied to the gate electrode. The electrodes may be formed or deposited using conventional processes known in the art.

The various components of the TFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconductor layer should both be in contact with the dielectric layer. In addition, the source and drain electrodes should both be in contact with the semiconductor layer.

The TFT of the present disclosure may be fabricated by depositing a semiconductor layer upon a substrate. The performance-enhancing overcoat layer is then deposited upon the semiconductor layer. In one embodiment, the overcoat layer is deposited by liquid deposition. Optionally, the transistor may be thermally annealed. If the semiconductor is a liquid crystalline semiconductor, the annealing is performed at a temperature within the liquid crystalline phase of the semiconductor. In other words, the semiconductor remains in a liquid crystal phase at the temperature at which the annealing is performed.

The following examples illustrate TFTs made according to the methods of the present disclosure. The examples are merely illustrative and are not intended to limit the present disclosure with regard to the materials, conditions, or process parameters set forth therein. All parts are percentages by weight unless otherwise indicated.

EXAMPLES

Control Example 1

A bottom-gate top-contact thin-film transistor was built. It comprised an n-doped silicon wafer with a thermally grown silicon oxide layer having a thickness of about 200 nanometers. The n-doped silicon wafer functioned as the gate electrode. The silicon oxide layer functioned as the dielectric layer and had a capacitance of about 15 nanofarads per square centimeter ($nF/cm^2$) as measured with a capacitor meter. The silicon wafer was cleaned by washing in isopropanol, cleaned by argon plasma, again washing in isopropanol, and air drying. A polythiophene (PQT), as disclosed in B. Ong et al, *J.*

*Am. Chem. Soc.*, 2004, 126(11):3378-79, was used to fabricate the semiconductor layer; it possessed a $M_w$ of 22,900 and $M_n$ of 17,300 relative to polystyrene standards. A semiconductor polythiophene layer about 30 nanometers thick was deposited on top of the substrate by spin coating of the polythiophene in dichlorobenzene solution at a speed of 1,000 rpm for about 100 to about 120 seconds, and dried in vacuum at 80° C. for about 2 to about 10 hours. Thereafter, the gold source and drain electrodes were deposited on top of the semiconductor polythiophene layer by vacuum evaporation through a shadow mask. The device was then annealed at 130° C. to about 140° C. for about 10 minutes to about 30 minutes. A Keithley 4200 SCS semiconductor characterization system was used to characterize the device. A thin film transistor with channel lengths of 65 and channel widths of 2050 microns was characterized by measuring its output and transfer curves. The device showed a mobility of 0.0007 $cm^2N$ sec and a current on/off ratio of $10^3$.

Preparation of Performance-Enhancing Layer 40 g methyltrimethoxysilane (from Aldrich), 10 g de-ionized water, and 100 g n-butanol were mixed together and refluxed for 5-8 hours with rigorous stirring. Poly(methyl silsesquioxane) was formed via hydrolyzing and condensation of the methyltrimethoxysilane monomer.

0.1 g $Al_2O_3$ nanoparticles (from Nanophase) with particle size of 47 nm were added into 0.9 g of the above solution. The mixture was subjected to ultrasonic for 1 hour at room temperature. A stable milk dispersion was obtained after filtration with a 1 micron glass filter.

Disclosure Example 1

A thin film transistor was made having a performance-enhancing layer prepared as described above. The TFT was fabricated using the same procedure as described in Control Example 1. Additionally, after vacuum deposition of the source and drain electrodes, the performance-enhancing overcoat layer was applied on top of the semiconductor layer by applying the dispersion (described above) and spin coating at 1000 rpm for about 60 seconds. After annealing, a thin film transistor with channel lengths of 65 microns and channel widths of 2050 microns was used for evaluation. The device showed a mobility of 0.03 $cm^2N$ sec and current on/off ratio of $10^5$. The mobility was improved by 40 times and the on/off ratio was improved by 2 orders of magnitude compared to Control Example 1.

Control Example 2

A thin film transistor was built using the same procedure as described in Control Example 1, but using different materials. Instead, a polyester sheet was used as the substrate. An aluminum coating on the polyester sheet served as the gate electrode. A polyacrylate layer about 2 microns thick on top of the aluminum layer served as the dielectric layer. The dielectric layer had a capacitance of about 2.9 $nF/cm^2$ as measured with a capacitor meter. A thin film transistor with channel lengths of 65 microns and channel widths of 2050 microns was used for evaluation. The device showed a mobility of 0.0014 $cm^2N$ sec and current on/off ratio of 660.

Disclosure Example 2

A thin film transistor was made having a performance-enhancing overcoat layer. The TFT was fabricated using the same procedure as described in Control Example 2. Additionally, after vacuum deposition of the source and drain electrodes, an overcoat layer was applied on top of the semiconductor layer by applying the dispersion (described above) and spin coating. After annealing, a thin film transistor with channel lengths of 65 microns and channel widths of 2050 microns was used for evaluation. The device showed a mobility of 0.025 $cm^2N$ sec and current on/off ratio of 1 04. The mobility was improved by about 20 times and the on/off ratio was improved by more than one order of magnitude compared to Control Example 2.

The above examples clearly demonstrated that the performance-enhancing overcoat layer dramatically improved device performance.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A bottom-gate thin film transistor comprising:
   a substrate;
   a single gate electrode;
   a polyacrylate dielectric layer;
   a polythiophene semiconductor layer;
   a performance-enhancing top layer comprising a polysilsesquioxane polymer;
   a source electrode; and
   a drain electrode;
   wherein the performance-enhancing top layer contacts the semiconductor layer and the semiconductor layer is between the dielectric layer and the performance-enhancing top layer;
   wherein the performance-enhancing top layer covers the semiconductor layer, the source electrode, and the drain electrode; and
   wherein the performance-enhancing top layer increases the mobility and the current on/off ratio of the transistor.

2. The thin film transistor of claim 1, wherein the polymer is poly(methyl silsesquioxane).

3. The thin film transistor of claim 2, wherein the performance-enhancing top layer further comprises inorganic particles.

4. The thin film transistor of claim 1, wherein the source and drain electrodes are not in contact with the performance-enhancing top layer.

* * * * *

UNITED STATES PATENT AND TRADEMARK OFFICE
CERTIFICATE OF CORRECTION

PATENT NO. : 8,134,144 B2
APPLICATION NO. : 11/317746
DATED : March 13, 2012
INVENTOR(S) : Yiliang Wu et al.

Page 1 of 1

It is certified that error appears in the above-identified patent and that said Letters Patent is hereby corrected as shown below:

In the Specifications:

Column 1, lines 7 and 8, after "Cooperative Agreement No.", please delete "70NANBOH3033" and insert --70NANB0H3033--.

Signed and Sealed this
Third Day of September, 2013

Teresa Stanek Rea
*Acting Director of the United States Patent and Trademark Office*